(12) United States Patent
Lin

(10) Patent No.: US 8,841,947 B2
(45) Date of Patent: Sep. 23, 2014

(54) POWER-ON RESET CIRCUIT

(71) Applicant: Raydium Semiconductor Corporation, Hsinchu (TW)

(72) Inventor: Li Ping Lin, Kaohsiung (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/067,383

(22) Filed: Oct. 30, 2013

(65) Prior Publication Data
US 2014/0049300 A1    Feb. 20, 2014

Related U.S. Application Data

(62) Division of application No. 13/464,380, filed on May 4, 2012, now abandoned.

(30) Foreign Application Priority Data

May 6, 2011 (TW) .............................. 100115890 A

(51) Int. Cl.
*H03L 7/00*   (2006.01)
*H03K 3/356*  (2006.01)
*H03K 17/22*  (2006.01)

(52) U.S. Cl.
CPC ........ *H03K 3/356191* (2013.01); *H03K 17/223* (2013.01)
USPC ................................ 327/143; 327/81; 327/87

(58) Field of Classification Search
USPC .................... 327/77, 80, 81, 85, 87, 143, 198
See application file for complete search history.

(56) References Cited

U.S. PATENT DOCUMENTS

2003/0201807 A1*  10/2003  Ohbayashi et al. ........... 327/143

* cited by examiner

*Primary Examiner* — Long Nguyen

(57) ABSTRACT

A power on reset circuit is capable of changing logic level of reset signal at different threshold voltages.

5 Claims, 6 Drawing Sheets

POWER-ON RESET CIRCUIT

CROSS REFERENCE TO RELATED APPLICATION

This application is a divisional application of prior application Ser. No. 13/464,380, filed on May 4, 2012 by the present inventor, entitled "POWER-ON RESET CIRCUIT," which is hereby incorporated by reference.

BACKGROUND

1. Field of the Invention

The present invention relates to a power-on reset circuit and, in particular, to a power-on reset circuit capable of changing a logic level of a reset signal at multiple threshold voltages.

2. Description of the Related Art

Most electronic devices have a power-on reset circuit, which is used for outputting a reset signal to logic components of the electronic device. The logic components include, for example, registers, counters and flip-flops, which are sensitive to starting status during boot-up. During periods with power supply inconsistencies, the power-on reset circuit outputs a reset signal to restart the electronic device.

FIG. 1 is a schematic view of a conventional power-on reset circuit 10. The power-on reset circuit 10 includes a pull-up component 12 and a pull-down circuit 14. The pull-up component 12 is a P-MOSFET $MP_1$ and the pull-down component 14 is an N-MOSFET $MN_1$.

FIG. 2 is a schematic view of a waveform chart of a reset signal and a threshold voltage of the conventional power-on reset circuit 10 illustrated in FIG. 1. Referring also to FIG. 1, the conductive capability of the P-MOSFET $MP_1$ is different from the conductive capability of the N-MOSFET $MN_1$, so while the voltage level of the power supply $V_{DD}$ is 0V, the P-MOSFET $MP_1$ is not conducted. Therefore, a voltage, Reset_f, of a capacitor $C_1$ is 0V and a logic level, Reset, at an output node $N_2$ of the power-on reset circuit 10 is 0.

While the voltage level of the power supply $V_{DD}$ reaches a threshold voltage $V_{RES}$, the conductive capability of the P-MOSFET is stronger than the capability of the N-MOSFET, so the first logic component $X_1$ may make a transition for changing an outputted logic level. Meanwhile, a logic level at the output node $N_2$ of the power-on reset circuit 10 is 1 and the power-on reset circuit 10 may output a reset signal, Reset, having a high logic level to other circuits, not shown, for resetting the circuits in logic level.

When the power supply $V_{DD}$ is closed, voltage of the power supply $V_{DD}$ may begin decreasing. When the voltage level of the power supply $V_{DD}$ is less than the threshold voltage $V_{RES}$, the conductive capability of the P-MOSFET $MP_1$ is weaker than the conductive capability of the N-MOSFET $MN_1$, so the first logic component $X_1$ may make a transition for changing an outputted logic level. Meanwhile, the logic level at the output node $N_2$ of the power-on reset circuit 10 may be changed from 1 to 0, so the logic level of the reset signal, Reset, may be 0.

To overcome the disadvantage of the prior art in that the conventional circuit can only change the logic level of the reset signal with respect to a single voltage threshold $V_{RES}$, the present invention provides a power-on reset circuit which is capable of changing logic level of reset signal with respect to multiple threshold voltages.

SUMMARY

In accordance with one embodiment of the present invention, a power-on reset circuit comprises a first pull-up component, a second pull-up component, a first pull-down component, and a first logic component. The first pull-up component is coupled between a power supply and a first node. The second pull-up component is coupled between the power supply and a second node. The first pull-down component is coupled to the first node and a common node, and the first logic component is coupled between the first node and the second node. Moreover, the second pull-up component is actuated based on a voltage at the second node.

In accordance with one embodiment of the present invention, a power-on reset circuit comprises a first pull-up component, a first pull-down component, a second pull-down component, a first logic component, and a second logic component. The first pull-up component is coupled between a power supply and a first node. The first pull-down component is coupled between the first node and the common node. The second pull-down component is coupled between the common node and a third node. The first logic component is coupled between the first node and the second node, and a second logic component is coupled between the second node and the third node. The second pull-down component is actuated based on a voltage at the third node.

In order to provide further understanding of the techniques, means, and effects of the current disclosure, the following detailed description and drawings are hereby presented, such that the purposes, features and aspects of the current disclosure may be thoroughly and concretely appreciated; however, the drawings are provided solely for reference and illustration, without any intention to be used for limiting the current disclosure.

BRIEF DESCRIPTION OF THE DRAWINGS

The objectives and advantages of the present invention are illustrated with the following description and upon reference to the accompanying drawings in which.

DETAILED DESCRIPTION OF THE INVENTION

The present invention discloses a power-on reset circuit which is capable of changing logic level of a reset signal at multiple threshold voltages.

Figure 1:
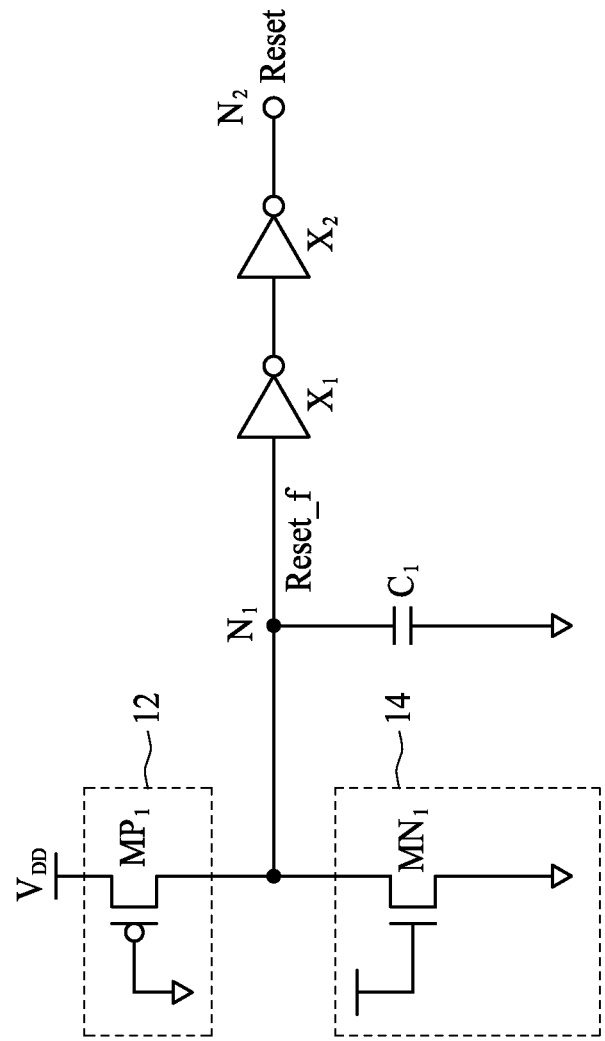
FIG. 1 is a schematic view of a conventional power-on reset circuit.
Figure 2:
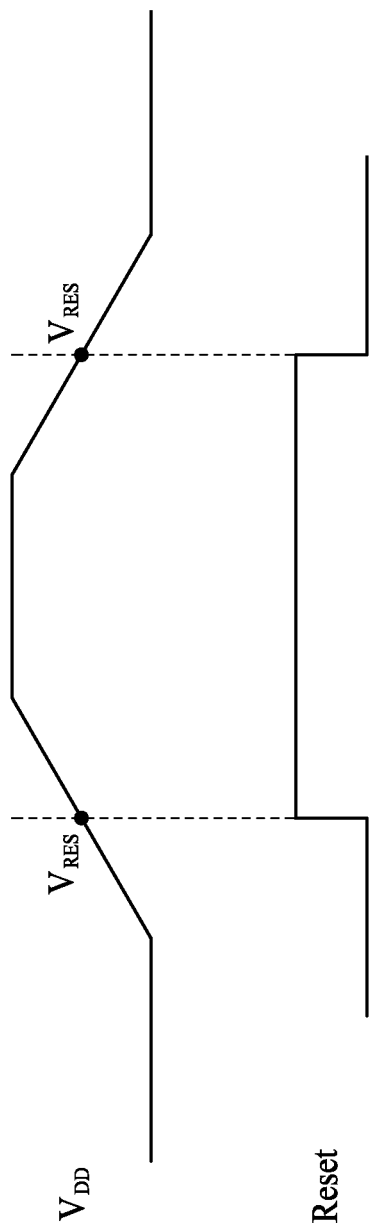
FIG. 2 is a schematic view of a waveform chart of a reset signal and a threshold voltage of a conventional power-on reset circuit.
Figure 3:
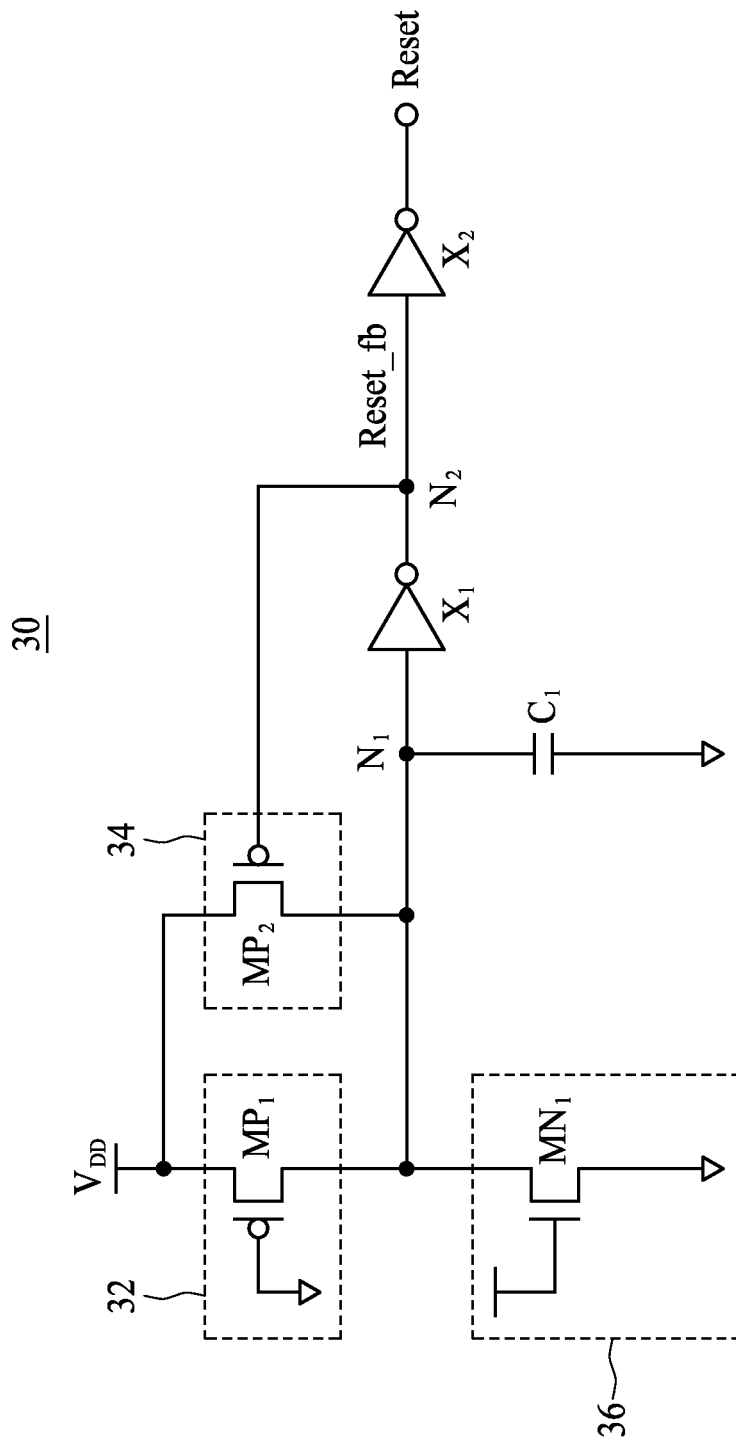
FIG. 3 is a schematic view of one embodiment of the present invention showing a power-on reset circuit.

FIG. 3 is a schematic view of one embodiment of the present invention showing a power-on reset circuit 30. The power-on reset circuit 30 includes a first pull-up component 32, a second pull-up component 34 and a first pull-down component 36. The first pull-up component 32 is coupled between a power supply $V_{DD}$ and a first node $N_1$. The second pull-up component 34 is coupled between the power supply $V_{DD}$ and a second node $N_2$.

The first pull-down component 36 is coupled between the first node $N_1$ and a common node, which is grounded. A first logic component $X_1$ is coupled between the first node $N_1$ and the second node $N_2$. The second pull-up component 34 is actuated based on a voltage, Reset_fb, at the second node $N_2$. Moreover, the power-on reset circuit 30 further includes a capacitor $C_1$, which is coupled between the first node $N_1$ and the common node.

The first pull-up component 32 is a P-MOSFET $MP_1$, which has a source connected to the power supply $V_{DD}$, a drain connected to the first node $N_1$, and a gate connected to the common node. The first pull down component 36 is an N-MOSFET $MN_1$, which has a source connected to the common node, a drain connected to the first node $N_1$, and a gate connected to the power supply $V_{DD}$.

The second pull-up component 34 includes a voltage control component or a P-MOSFET $MP_2$. The P-MOSFET $MP_2$ has a source connected to the power supply $V_{DD}$, a drain connected to the first node $N_1$, and a gate connected to the second node $N_2$.

Figure 4:
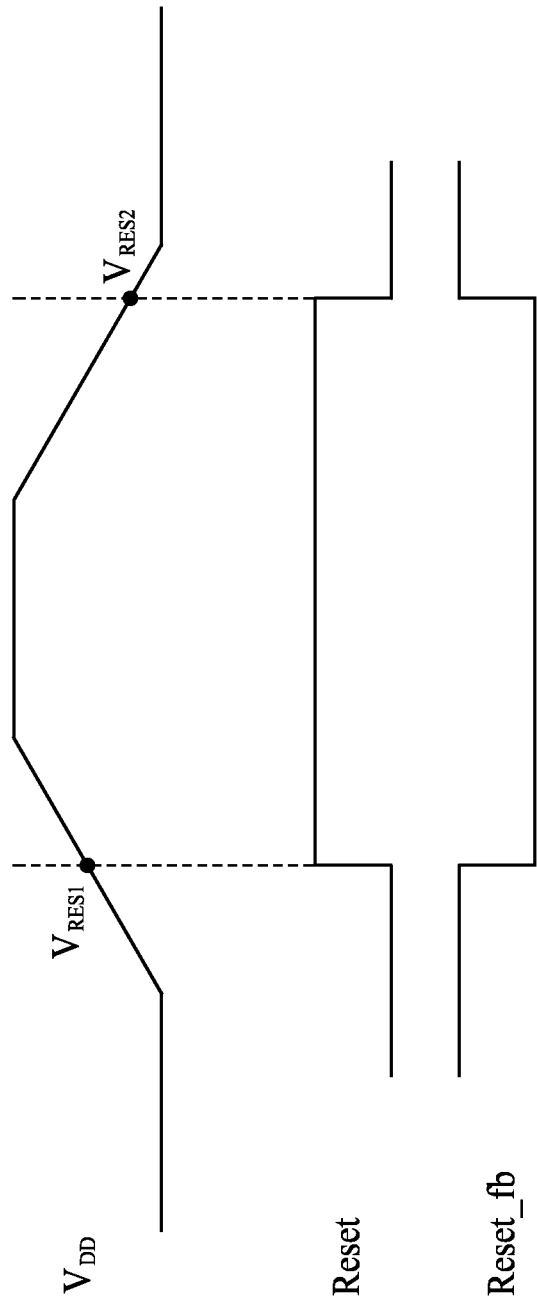
FIG. 4 is a schematic view of one embodiment of the present invention showing a waveform chart of a logic level of reset signal and a voltage level of the power supply of the power-on reset circuit.

FIG. 4 is a schematic view of one embodiment of the present invention showing a waveform chart of a logic level of reset signal and a voltage level of the power supply $V_{DD}$ of the power-on reset circuit 30. Referring also to FIG. 3, when the voltage level of the power supply $V_{DD}$ is 0V, the first pull-up component 32 has not been connected, and a voltage at the first node $N_1$ is 0V. Meanwhile, a logic level at the second node $N_2$, Reset_fb, is 0.

When the voltage of the power supply $V_{DD}$ reaches a threshold voltage $V_{RES1}$, a conduction capability of the first pull-up component 32 is stronger than a conduction capability of the first pull-down component 36. Therefore, the voltage at the first node $N_1$ increases and reaches a high voltage level, so that the first logic component $X_1$ makes a transition for outputting a logic level 0, the second pull-up component 34 may be conducted, and the power-on reset circuit 30 may output a reset signal to other circuits, not shown, for resetting the circuits in logic level.

While the voltage level of the power supply $V_{DD}$ decreases gradually, the first pull-up component 32 and the second pull-up component 34 are conducted. Therefore, when the voltage level of the power supply $V_{DD}$ decreases and reaches a threshold voltage $V_{RES2}$, the first logic component $X_1$ makes a transition for outputting a logic level 1 so that the power-on reset circuit 30 may output a reset signal having a low logic level to other circuits, not shown, for resetting the circuits in logic level.

Figure 5:
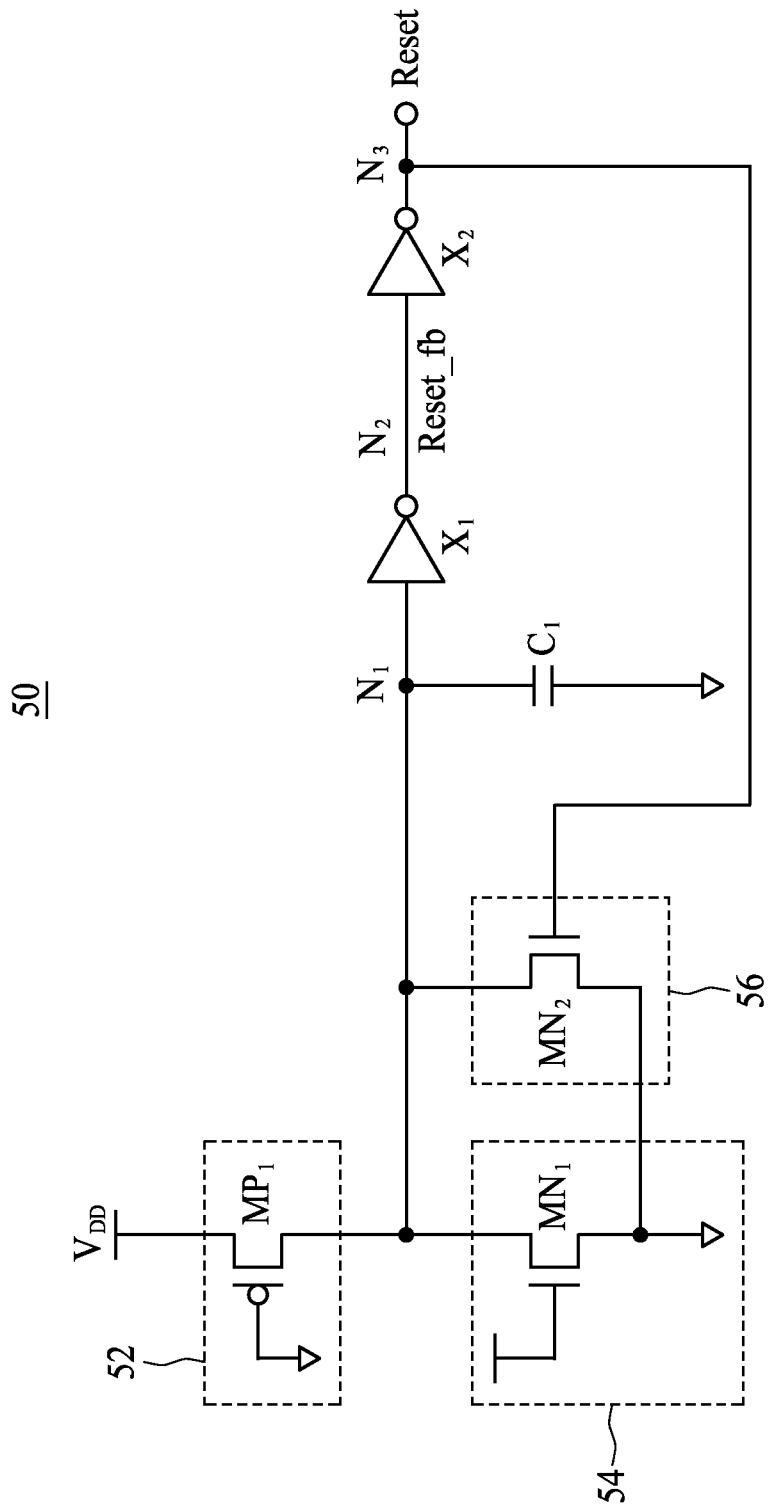
FIG. 5 is a schematic view of one embodiment of the present invention indicating a power-on reset circuit.

FIG. 5 is a schematic view of one embodiment of the present invention indicating a power-on reset circuit 50. The power-on reset circuit includes a first pull-up component 52, a first pull-down component 54, and a second pull-down component 56. The first pull-up circuit 52 is coupled between a power supply $V_{DD}$ and a first node $N_1$. The first pull-down component 54 is coupled between the first node $N_1$ and a common node, which is grounded.

A second pull-down component 56 is coupled between the common node and a third node $N_3$. A first logic component $X_1$ is coupled between the first node $N_1$ and the second node $N_2$, while a second logic component $X_2$ is coupled between the second node $N_2$ and the third node $N_3$. The second pull-down component 56 is actuated based on a voltage at the third node $N_3$. The power-on reset circuit further includes a capacitor $C_1$, which is coupled between the first node $N_1$ and the common node.

The first pull-up component 52 includes a P-MOSFET $MP_1$ which has a source coupled to the power supply, a drain coupled to the first node, and a gate coupled to the common node. The first pull-down component includes an N-MOSFET $MN_1$, which has a source coupled to the common node, a drain coupled to the first node, and a gate coupled to the power supply.

The second pull-down component 56 includes a voltage control component or an N-MOSFET $MN_2$. The N-MOSFET $MN_2$ has a source coupled to the common node, a drain coupled to the first node $N_1$, and a gate coupled to the third node $N_3$.

Figure 6:
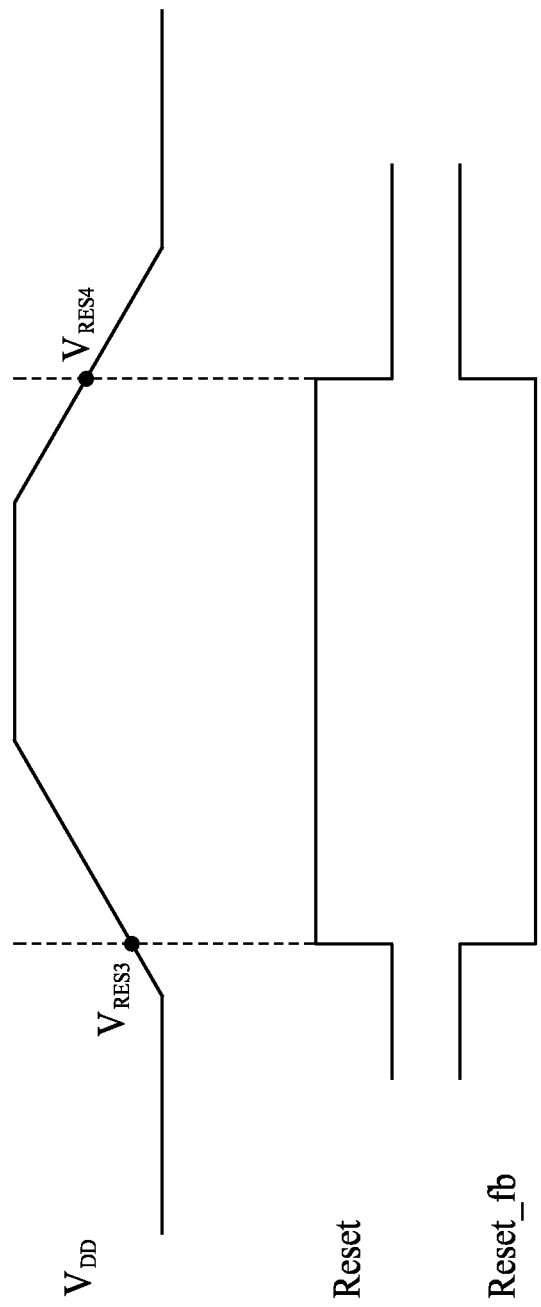
FIG. 6 is a schematic view of one embodiment of the present invention indicating a waveform chart of a voltage level of the reset signal and a voltage level of the power supply of a power-on reset circuit.

FIG. 6 is a schematic view of one embodiment of the present invention indicating a waveform chart of a voltage level of the reset signal and a voltage level of the power supply $V_{DD}$ of a power-on reset circuit 50. Referring to FIG. 5, when the voltage level of the power supply $V_{DD}$ is 0V, a logic level, Reset_fb, at the second node N2 is 1 and a voltage logic level, Reset, at an output node of the power-on reset circuit 50 is 0.

When the voltage of the power supply $V_{DD}$ reaches a threshold voltage $V_{RES3}$, a conduction capability of the first pull-up component 52 is stronger than a conduction capability of the first pull-down component 54. Therefore, the voltage at the first node $N_1$ is raised to a high voltage, equal to $V_{RES3}$, by the first pull-up component 52, so that the first logic component $X_1$ makes a transition for outputting a logic level 0, and the second logic component makes a transition for outputting a logic level 1.

When the logic level of the first logic component $X_1$ is 0, the logic level, Reset, at the output node is 1 and the voltage logic level, Reset_fb, at the second node $N_2$ is 0, the power-on reset circuit 50 outputs a reset signal, Reset, having a high logic level to other circuits, not shown, for resetting the circuits in logic level.

As the voltage level of the power supply $V_{DD}$ decreases gradually, the first pull-down component 54 and the second pull-down component 56 are conducted. Therefore, when the voltage level of the power supply $V_{DD}$ decreases and reaches a threshold voltage $V_{RES4}$, the first logic component $X_1$ and the second logic component $X_2$ make a transition, and, meanwhile, the threshold voltage $V_{RES4}$ is greater than or equal to the threshold voltage $V_{RES3}$. The power-on reset circuit 50 outputs a reset signal, Reset, having a low logic level to other circuits, not shown, for resetting the circuits in logic level.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A power-on reset circuit, comprising:
   a first pull-up component, coupled between a power supply and a first node;

a first pull-down component, coupled between the first node and a common node;

a second pull-down component, coupled between the common node and a third node;

a first logic component, coupled between the first node and a second node; and a second logic component, coupled between the second node and the third node, wherein the second pull-down component is actuated based on a voltage at the third node;

wherein the second node is coupled at the input of the second logic component; and wherein the third node is coupled at the output of the second logic component.

2. The power-on reset circuit of claim 1, wherein the first pull-up component includes a P-MOSFET, which has a source connected to the power supply, a drain connected to the first node, and a gate connected to the common node, wherein the first pull-down includes an N-MOSFET, which has a source connected to the common node, a drain connected to the first node, and a gate connected to the power supply.

3. The power-on reset circuit of claim 1, wherein the second pull-up component includes an N-MOSFET or a voltage control component.

4. The power-on reset circuit of claim 3, wherein the N-MOSFET has a source connected to the common node, a drain connected to the first node, and a gate connected to the third node.

5. The power-on reset circuit of claim 1, further comprising a capacitor coupled between the first node and the common node.

* * * * *